(12) United States Patent
Choe

(10) Patent No.: US 11,481,124 B2
(45) Date of Patent: Oct. 25, 2022

(54) MEMORY SYSTEMS AND METHODS OF TRAINING THE MEMORY SYSTEMS

(71) Applicant: SK hynix Inc., Icheon-si (KR)

(72) Inventor: Woo Young Choe, Gwacheon-si (KR)

(73) Assignee: SK hynix Inc., Icheon-si (KR)

( * ) Notice: Subject to any disclaimer, the term of this patent is extended or adjusted under 35 U.S.C. 154(b) by 63 days.

(21) Appl. No.: 16/910,496

(22) Filed: Jun. 24, 2020

(65) Prior Publication Data
US 2021/0165587 A1 Jun. 3, 2021

(30) Foreign Application Priority Data
Dec. 3, 2019 (KR) .......................... 10-2019-0159427

(51) Int. Cl.
*G06F 3/06* (2006.01)
*G06F 9/4401* (2018.01)

(52) U.S. Cl.
CPC .......... *G06F 3/0629* (2013.01); *G06F 3/0604* (2013.01); *G06F 3/0673* (2013.01); *G06F 9/4401* (2013.01)

(58) Field of Classification Search
CPC .... G06F 9/4401; G06F 3/0604; G06F 3/0629; G06F 3/0673
See application file for complete search history.

(56) References Cited

U.S. PATENT DOCUMENTS

| | | | | |
|---|---|---|---|---|
| 6,028,816 A * | 2/2000 | Takemae | ................ | H03L 7/00 365/233.1 |
| 6,981,179 B1 * | 12/2005 | Shigemasa | ........... | G06K 19/073 714/36 |
| 7,793,063 B1 * | 9/2010 | White | ................. | G11C 29/023 702/89 |
| 2009/0109770 A1 * | 4/2009 | Sugishita | ............ | G06F 13/1689 365/193 |
| 2010/0005281 A1 * | 1/2010 | Buchmann | .......... | G06F 13/4243 713/2 |
| 2011/0267117 A1 * | 11/2011 | Choi | ........................ | H03L 7/00 327/156 |
| 2012/0137084 A1 * | 5/2012 | Ok | ........................ | G11C 7/1093 711/154 |
| 2014/0181392 A1 * | 6/2014 | Malladi | ................ | G11C 29/028 711/105 |
| 2016/0103615 A1 * | 4/2016 | Lendvay | .................. | G11C 8/12 711/154 |
| 2016/0162404 A1 * | 6/2016 | Lee | ........................... | G11C 5/04 711/120 |
| 2017/0371560 A1 | 12/2017 | MacGarry et al. | | |
| 2018/0203816 A1 * | 7/2018 | Cho | .................... | G06F 13/4081 |
| 2019/0172516 A1 * | 6/2019 | Kim | ....................... | G11C 29/50 |
| 2019/0355399 A1 * | 11/2019 | Hwang | ................ | G11C 7/1093 |
| 2020/0004557 A1 * | 1/2020 | Nam | .................... | G06F 12/0238 |
| 2020/0342923 A1 * | 10/2020 | Lee | ....................... | G11C 29/028 |
| 2021/0065836 A1 * | 3/2021 | Ahn | ................. | G11C 29/12015 |

* cited by examiner

*Primary Examiner* — Prasith Thammavong
(74) *Attorney, Agent, or Firm* — William Park & Associates Ltd.

(57) ABSTRACT

A memory system includes a memory medium and a memory controller configured to control the memory medium. The memory controller includes a training core and a training block. The training core is configured to detect a delay time of a clock signal to generate a delay selection signal during a training operation for the memory medium. The training block is configured to generate a delayed clock signal which is delayed by a time period set according to the delay selection signal outputted from the training core.

9 Claims, 7 Drawing Sheets

MEMORY SYSTEMS AND METHODS OF TRAINING THE MEMORY SYSTEMS

CROSS-REFERENCE TO RELATED APPLICATIONS

The present application claims priority under 35 U.S.C 119(a) to Korean Application No. 10-2019-0159427, filed on Dec. 3, 2019, which is incorporated herein by references in its entirety.

BACKGROUND

1. Technical Field

Various embodiments of the present teachings relate to semiconductor memory and, more particularly, to semiconductor memory systems and methods of training the semiconductor memory systems.

2. Related Art

Semiconductor memory devices are memory devices that are realized using a semiconductor material such as a silicon material, a germanium material, a gallium arsenide material, an indium phosphide material, or the like. Semiconductor memory devices may be typically categorized as either volatile memory devices or nonvolatile memory devices. Volatile memory devices lose their stored data when their power supplies are interrupted. For example, volatile memory devices may include static random access memory (SRAM) devices, dynamic random access memory (DRAM) devices, and synchronous dynamic random access memory (SDRAM) devices. In contrast, nonvolatile memory devices retain their stored data even when their power supplies are interrupted. Nonvolatile memory devices may include read only memory (ROM) devices, programmable read only memory (PROM) devices, erasable programmable read only memory (EPROM) devices, electrically erasable programmable read only memory (EEPROM) devices, flash memory devices, phase change random access memory (PRAM) devices, magnetic random access memory (MRAM) devices, resistive random access memory (RRAM) devices, ferroelectric random access memory (FRAM) devices, etc.

In general, access to memory devices may be achieved using a controller. For example, in order to perform a read operation of a memory device, a host may output a read command and an address to a controller and the controller may transmit data to the host after reading out the data from the memory device. In addition, in order to perform a write operation of the memory device, the host may output a write command, write data, and an address to the controller, and the controller may store the write data into the memory device. During the access to the memory device, a data strobe signal (also, denoted by the abbreviated term "DQS") outputted from the memory device is not synchronized with an internal clock signal in the controller, resulting in a timing skew. Thus, it may be necessary to execute a training operation of the memory device in order to minimize the timing skew. The training operation of the memory device may be executed by delaying the internal clock signal of the controller using the data strobe signal DQS outputted from the memory device as a reference signal.

SUMMARY

A memory system according to an embodiment includes a memory medium and a memory controller configured to control the memory medium. The memory controller includes a training core and a training block. The training core is configured to detect a delay time of a clock signal to generate a delay selection signal during a training operation for the memory medium. The training block is configured to generate a delayed clock signal which is delayed by a time period set according to the delay selection signal outputted from the training core.

According to another embodiment, there is provided a method of training a memory system including a memory medium and a memory controller to control the memory medium. The method includes transmitting a training command, which is generated and outputted from a training core, to a training block. A read operation for the memory medium is performed in response to the training command to transmit a data strobe signal from the memory medium to the training core. The data strobe signal is sampled using the training core to generate a delay selection signal. A delayed clock signal, which is delayed by a time period set according to the delay selection signal in the training block, is transmitted to the memory medium.

BRIEF DESCRIPTION OF THE DRAWINGS

Certain features of the disclosed technology are illustrated in various embodiments with reference to the attached drawings, in which.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean a relative position relationship, but not used to limit certain cases in which the element directly contacts the other element, or at least one intervening element is present therebetween. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements therebetween.

Various embodiments are directed to memory systems and methods of training the memory systems.

Figure 1:
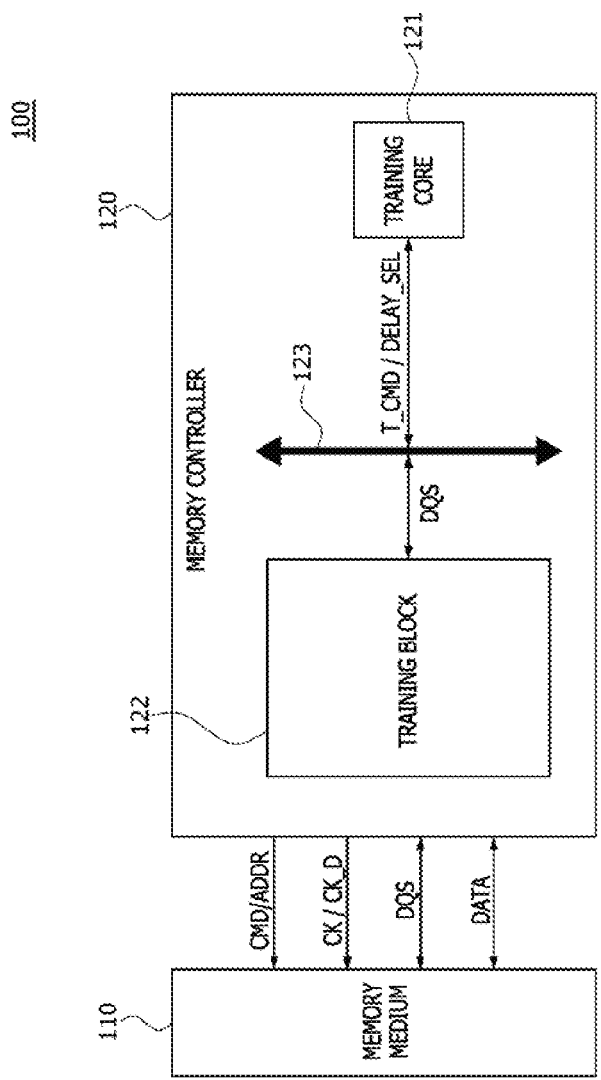
FIG. 1 is a block diagram illustrating a memory system according to an embodiment of the present teachings.

FIG. 1 is a block diagram illustrating a memory system 100 according to an embodiment of the present teachings. Referring to FIG. 1, the memory system 100 may be configured to include a memory medium 110 and a memory controller 120. In an embodiment, the memory system 100 may be a single system including the memory medium 110 and the memory controller 120 which are integrated on the same substrate. In another embodiment, the memory medium 110 and the memory controller 120 of the memory system 100 may be separate devices.

The memory medium 110 may store external data which are inputted through the memory controller 120 or may store data to be outputted through the memory controller 120. The memory medium 110 may be realized using at least one of various storage media including a volatile memory device and a nonvolatile memory device. For example, when the memory medium 110 includes a volatile memory device, the memory medium 110 may include a dynamic random access memory (DRAM) device, a static random access memory (SRAM) device, a thyristor RAM device, a zero capacitor RAM (Z-RAM) device, a twin transistor RAM (TTRAM) device, a magnetic RAM (MRAM) device, or the like. The memory system 100 according to the present embodiment may include various storage media such as volatile memory devices.

When the memory medium 110 includes a nonvolatile memory device, the memory medium 110 may include an electrically erasable programmable read-only memory (EPROM) device, a flash memory device, a magnetic RAM (MRAM) device, a spin-transfer torque MRAM (STTM) device, a ferroelectric RAM (FRAM) device, a phase change RAM (PRAM) device, or a resistive RAM (RRAM) device. Each of unit cells of the nonvolatile memory device may store one-bit datum or multi-bit data.

The memory controller 120 may control a read operation and a write operation of the memory medium 110. Moreover, the memory controller 120 may perform a training operation for the memory medium 110 when a booting operation is performed or specific instructions (e.g., external training instructions) are inputted. The training operation for the memory medium 110 may improve the reliability of data transmission or signal transmission between the memory medium 110 and the memory controller 120. The memory controller 120 may transmit a clock signal CK/CK_D to the memory medium 110. During the training operation for the memory medium 110, the clock signal transmitted from the memory controller 120 to the memory medium 110 may be a delayed clock signal CK_D whose phase is delayed by a certain time through the training operation. During the normal read operation and the write operation for the memory medium 110, the clock signal transmitted from the memory controller 120 to the memory medium 110 may be a clock signal CK whose phase adjustment is completed by the training operation. The memory controller 120 may transmit a command/address signal CMD/ADDR synchronized with the clock signal CK to the memory medium 110. The memory medium 110 may perform the read operation and the write operation of data DATA in synchronization with a data strobe signal DQS, based on the command/address signal CMD/ADDR.

In the case of the read operation for the memory medium 110, the memory medium 110 may receive an active command and a row address together with the clock signal CK from the memory controller 120. After a certain time period elapses, the memory medium 110 may receive a column address from the memory controller 120. After a certain time period elapses, the memory medium 110 may transmit the data DATA stored in a region designated by the row address and the column address to the memory controller 120. In the case of the write operation for the memory medium 110, the memory medium 110 may receive the active command and the row address together with the clock signal CK from the memory controller 120. After a certain time period elapses, the memory medium 110 may receive a write command and the column address from the memory controller 120. After a certain time period elapses, the memory medium 110 may receive the data DATA to be stored therein from the memory controller 120. The memory medium 110 may write the data into a region designated by the row address and the column address.

The memory medium 110 may receive the data DATA and the data strobe signal DQS from the memory controller 120. The data strobe signal DQS may be a kind of clock signal, and the data DATA inputted to the memory medium 110 may be synchronized with the data strobe signal DQS. The data strobe signal DQS may be transmitted from the memory medium 110 to the memory controller 120 when the memory medium 110 outputs the data DATA to the memory controller 120. In such a case, the data DATA inputted to the memory controller 120 may be synchronized with the data strobe signal DQS.

The memory controller 120 may include a training core 121, a training block 122, and a bus 123. The training core 121 may generate and output a training command T_CMD instructing execution of the training operation for the memory medium 110. The training core 121 may receive the data strobe signal DQS from the memory medium 110 during the training operation for the memory medium 110. The training core 121 may detect a timing skew between the data strobe signal DQS and the clock signal CK. In order to detect the timing skew between the data strobe signal DQS and the clock signal CK, the training core 121 may include a sampling circuit. The training core 121 may output a delay selection signal DELAY_SEL for removing the timing skew. The training command T_CMD and the delay selection signal DELAY_SEL outputted from the training core 121 may be transmitted to the training block 122 through the bus 123.

If the training command T_CMD is transmitted from the training core 121 to the training block 122, then the memory controller 120 may request the data strobe signal DQS from the memory medium 110. In order to request and obtain the data strobe signal DQS, the memory controller 120 may perform the write operation and the read operation for the memory medium 110. In the case that only the data stored in the memory medium 110 are used to obtain the data strobe signal DQS, only the read operation for the memory medium 110 might be performed. The data strobe signal DQS outputted from the memory medium 110 may be transmitted to the training block 122. The training block 122 may transmit the data strobe signal DQS to the training core 121 through the bus 123. The training block 122 may transmit the delayed clock signal CK_D, which is selected by the delay selection signal DELAY_SEL outputted from the training core 121, to the memory medium 110. The memory medium 110 may adjust a phase of the data strobe signal DQS generated by the memory medium 110 in response to the delayed clock signal CK_D.

Figure 2:
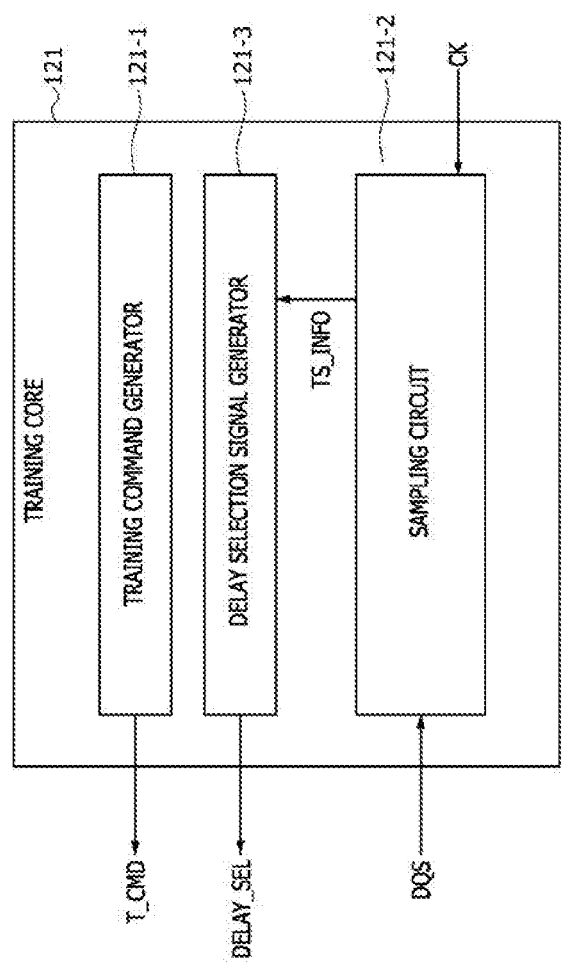
FIG. 2 illustrates an example of a training core included in the memory system illustrated in FIG. 1.

FIG. 2 illustrates an example of a configuration of the training core 121 included in the memory system 100 shown in FIG. 1. Referring to FIG. 2, the training core 121 may be configured to include a training command generator 121-1, a sampling circuit 121-2, and a delay selection signal generator 121-3. The training command generator 121-1 may generate and output the training command T_CMD instructing the training operation during a system booting operation or may generate and output the training command T_CMD instructing the training operation in response to external training instructions. The sampling circuit 121-2 may receive the data strobe signal DQS outputted from the memory medium (110 of FIG. 1) and the clock signal CK when the training operation is performed. The data strobe signal DQS may be inputted to the sampling circuit 121-2 through the training block (122 of FIG. 1). The sampling circuit 121-2 may perform a sampling operation for the data strobe signal DQS using the clock signal CK as a reference signal, thereby outputting a timing skew information signal TS_INFO including information on a phase difference (i.e., a timing skew) between the clock signal CK and the data strobe signal DQS. The delay selection signal generator 121-3 may receive the timing skew information signal TS_INFO from the sampling circuit 121-2 to output the delay selection signal DELAY_SEL having delay time information for minimizing the timing skew.

Figure 3:
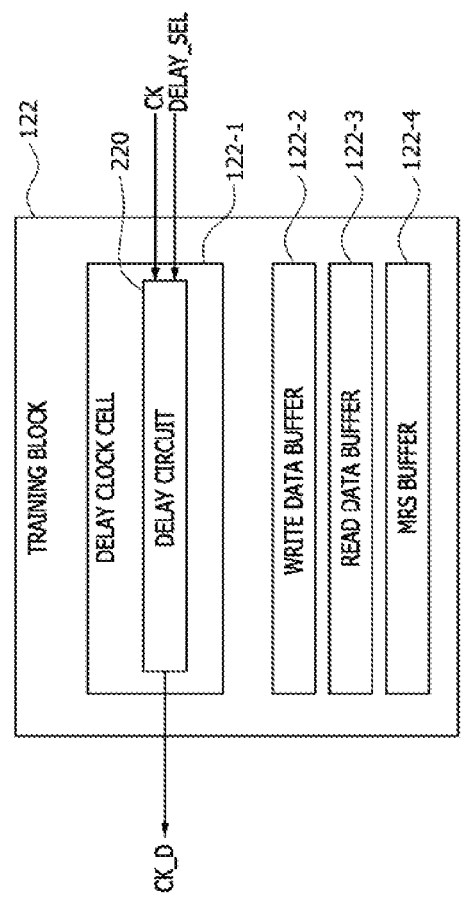
FIG. 3 illustrates an example of a training block included in the memory system illustrated in FIG. 1.
Figure 4:
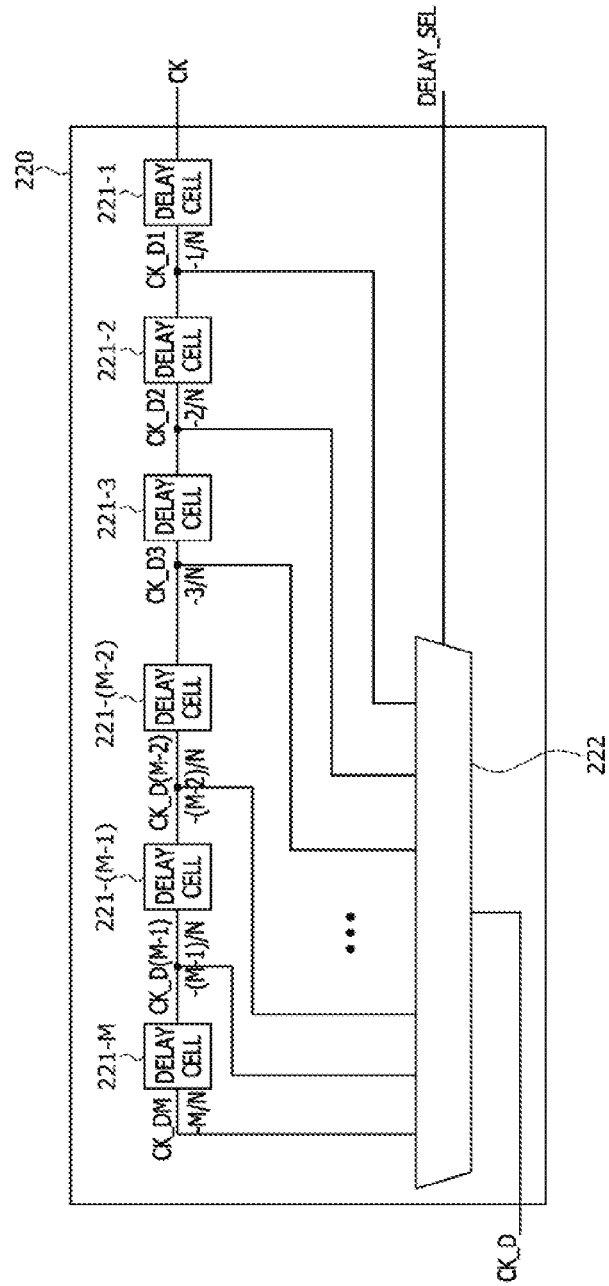
FIG. 4 illustrates an example of a delay circuit included in the training block illustrated in FIG. 3.

FIG. 3 illustrates an example of a configuration of the training block 122 included in the memory system 100 shown in FIG. 1, and FIG. 4 illustrates an example of a delay circuit 220 of the training block 122 illustrated in FIG. 3. Referring to FIG. 3, the training block 122 may include a delay clock cell 122-1, a write data buffer 122-2, a read data buffer 122-3, and a mode register set (MRS) buffer 122-4. The delay clock cell 122-1 may include the delay circuit 220. The write data buffer 122-2 may store write data when data are written into the memory medium (110 of FIG. 1) to provide the write data during the training operation. The read data buffer 122-3 may store read data which are read out of the memory medium (110 of FIG. 1) during the training operation. The MRS buffer 122-4 may store various set values by which the training operation for the memory medium (110 of FIG. 1) is performed. For example, the MRS buffer 122-4 may store an algorithm of an operation which is performed in response to the training command T_CMD and the delay selection signal DELAY_SEL which are outputted from the training core 121.

As illustrated in FIG. 4, the delay circuit 220 may receive the clock signal CK and the delay selection signal DELAY_SEL from the training core (121 of FIG. 1) to output the delayed clock signal CK_D, the phase of which is delayed. The delay circuit 220 may be configured to include a plurality of delay cells (e.g., first to $M^{th}$ delay cells 221-1~221-M) and a multiplexer 222. The first to $M^{th}$ delay cells 221-1~221-M may be coupled in series. The first delay cell 221-1 may receive the clock signal CK. An output signal CK_D1 of the first delay cell 221-1 may be inputted to the second delay cell 221-2, and an output signal CK_D2 of the second delay cell 221-2 may be inputted to the third delay cell 221-3. In this way, an output signal CK_D(M−1) of the (M−1)$^{th}$ delay cell 221-(M−1) may be inputted to the $M^{th}$ delay cell 221-M.

The output signals CK_D1, . . . , and CK_DM of the first to $M^{th}$ delay cells 221-1, . . . , and 221-M may also be inputted to input terminals of the multiplexer 222, respectively. That is, the output signal CK_D1 of the first delay cell 221-1 may be simultaneously inputted to an input terminal of the second delay cell 221-2 and a first input terminal of the multiplexer 222, and the output signal CK_D2 of the second delay cell 221-2 may be simultaneously inputted to an input terminal of the third delay cell 221-3 and a second input terminal of the multiplexer 222. Similarly, the output signal CK_D(M−1) of the (M−1)$^{th}$ delay cell 221-(M−1) may be simultaneously inputted to an input terminal of the $M^{th}$ delay cell 221-M and an (M−1)$^{th}$ input terminal of the multiplexer 222, and the output signal CK_DM of the $M^{th}$ delay cell 221-M may be inputted to an $M^{th}$ input terminal of the multiplexer 222. The multiplexer 222 may output one of the output signals CK_D1, . . . , and CK_DM of the first to $M^{th}$ delay cells, which are inputted through the first to $M^{th}$ input terminals of the multiplexer 222, as the delayed clock signal CK_D. The multiplexer 222 may select any one of the output signals CK_D1, . . . , and CK_DM of the first to $M^{th}$ delay cells as the delayed clock signal CK_D based on the delay selection signal DELAY_SEL.

The delay circuit 220 may output the delayed clock signal CK_D whose phase is delayed by a certain time period as compared with a phase of the clock signal CK inputted to the first delay cell 221-1. Each of the first to $M^{th}$ delay cells 221-1, . . . , and 221-M may delay an input signal thereof by 1/N times a certain period to output the delayed input signal. Thus, the output signal CK_D1 of the first delay cell 221-1 may have a phase which is delayed by 1/N times the certain period as compared with a phase of the clock signal CK. The output signal CK_D2 of the second delay cell 221-2 may have a phase which is delayed by 2/N times the certain period as compared with a phase of the clock signal CK. In addition, the output signal CK_DM of the $M^{th}$ delay cell 221-M may have a phase which is delayed by M/N times the certain period as compared with a phase of the clock signal CK.

Hereinafter, to serve as an example, it may be assumed that the number 'M' of the delay cells 221-1, . . . , and 221-M is '256' and each of the delay cells 221-1, . . . , and 221-M delays an input signal thereof by 1/64 times a specific period to output the delayed input signal. The output signal CK_D1 of the first delay cell 221-1 may have a phase which is delayed by 1/64 times the specific period as compared with a phase of the clock signal CK. The output signal CK_D2 of the second delay cell 221-2 may have a phase which is delayed by 2/64 times the specific period as compared with a phase of the clock signal CK. The output signal CK_D (M−1) of the (M−1)$^{th}$ delay cell 221-(M−1) may have a phase which is delayed by 255/64 times the specific period as compared with a phase of the clock signal CK. Finally, the output signal CK_D256 of the 256$^{th}$ delay cell 221-256 may have a phase which is delayed by 256/64 times the specific period as compared with a phase of the clock signal CK.

In a general training operation, phase adjustment has been achieved by iteratively performing a step of delaying a clock signal by 1/64 times a certain period until a timing skew is minimized. However, according to the present embodiment, the delayed clock signal CK_D for minimizing the timing skew may be generated and transmitted to the memory medium 110 through a single procedure based on the delay selection signal DELAY_SEL outputted from the training core 121 without using the iterative loop procedures. Thus, it may be possible to reduce the time it takes to perform the training operation. Moreover, the training block 122 might be configured to include only four elements of the delay clock cell 122-1, the write data buffer 122-2, the read data buffer 122-3, and the mode register set (MRS) buffer 122-4 and might be configured to perform only an operation executed in response to a command and a control signal which are outputted from the training core 121. Accordingly, it may be possible to reduce a logic circuit area as compared with a case that the training core 121 is absent. In addition, it may be possible to more readily change a training procedure using only revision or modification of the training core 121 without logic change of the training block 122.

Figure 5:
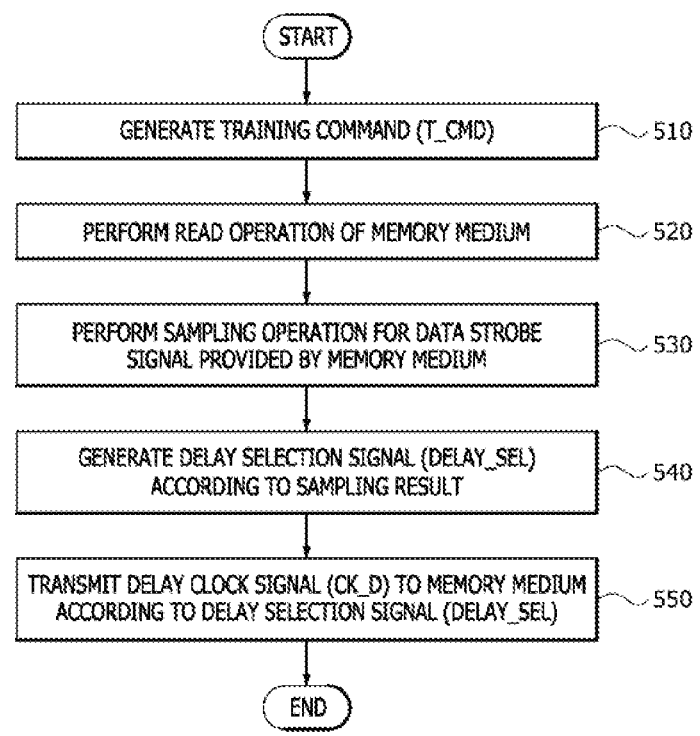
FIG. 5 is a flowchart illustrating a training operation of a memory system according to an embodiment of the present teachings.

FIG. 5 is a flowchart illustrating the training operation of the memory system 100 according to the present teachings. Referring to FIGS. 1, 4, and 5, when the memory system 100 is booted or external training instructions are inputted to the memory system 100, the training core 121 of the memory controller 120 may generate and output the training command T_CMD (see step 510). The training command T_CMD may be transmitted to the training block 122 through the bus 123. The memory controller 120 may perform the read operation for the memory medium 110 (see step 520). In an embodiment, the write operation for writing the write data stored in the write data buffer 122-2 of the training block 122 into the memory medium 110 may be performed prior to the step 520. In another embodiment, in the event that the read operation for reading out the data stored in the memory medium 110 is performed, the write operation may be omitted.

According to the read operation for the memory medium 110, the memory medium 110 may transmit the read data to the memory controller 120. The read data outputted from the memory medium 110 may be stored into the read data buffer 122-3 of the training block 122. When the read data are transmitted from the memory medium 110 to the memory controller 120, the memory medium 110 may transmit the data strobe signal DQS to the training block 122. The data strobe signal DQS may be transmitted from the training block 122 to the sampling circuit 121-2 of the training core 121 through the bus 123. The sampling circuit 121-2 may sample the data strobe signal DQS using the clock signal CK as a reference signal to generate and output the timing skew information signal TS_INFO (see step 530). The delay selection signal generator 121-3 of the training core 121 may generate the delay selection signal DELAY_SEL in response to the timing skew information signal TS_INFO (see step 540). The delay selection signal DELAY_SEL may be inputted to the delay circuit 220 of the delay clock cell 122-1 included in the training block 122 through the bus 123.

The delay circuit 220 may output one of the output signals CK_D1, . . . , and CK_DM of the delay cells 221-1, . . . , and 221-M, which are sequentially generated at a regular time interval, as the delayed clock signal CK_D (see step 550). The delayed clock signal CK_D outputted from the delay circuit 220 may be selected by the delay selection signal DELAY_SEL. The delay selection signal DELAY_SEL may be set such that the delayed clock signal CK_D outputted from the multiplexer 222 has a delay time corresponding to the timing skew between the data strobe signal DQS and the clock signal CK. Thus, it may be possible to minimize the timing skew between the data strobe signal DQS and the clock signal CK through a single procedure based on the delay selection signal DELAY_SEL without repeatedly delaying the clock signal CK at a regular time interval. If the delayed clock signal CK_D outputted from the delay circuit 220 of the delay clock cell 122-1 included in the training block 122 is transmitted to the memory medium 110, then the training operation may terminate.

Figure 6:
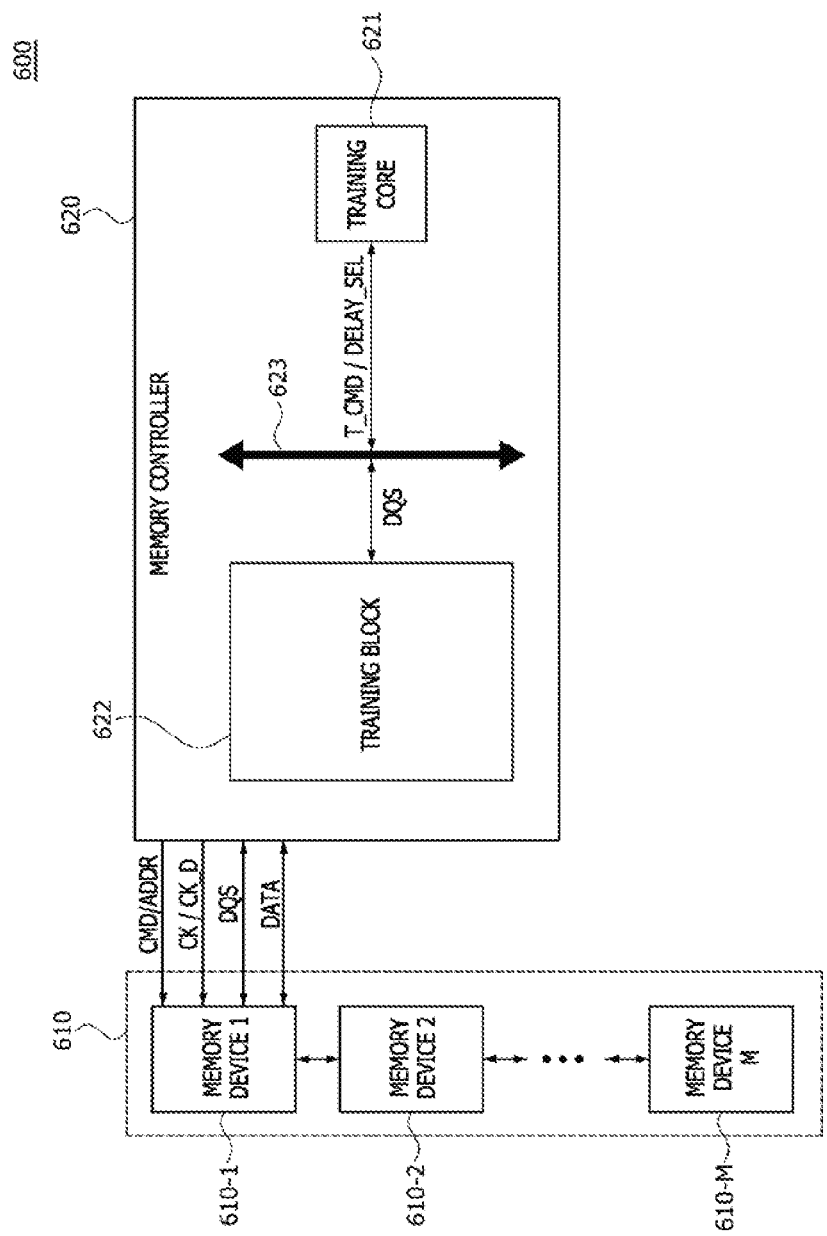
FIG. 6 is a block diagram illustrating a memory system according to another embodiment of the present teachings.

FIG. 6 is a block diagram illustrating a memory system 600 according to another embodiment of the present teachings. Referring to FIG. 6, the memory system 600 may be configured to include a memory medium 610 and a memory controller 620. In an embodiment, the memory system 600 may be a single system including the memory medium 610 and the memory controller 620 which are integrated on the same substrate. In another embodiment, the memory medium 610 and the memory controller 620 of the memory system 600 may be separate devices.

The memory medium 610 may include a plurality of memory devices, for example, first to $M^{th}$ memory devices 610-1, 610-2, . . . , and 610-M. In an embodiment each of the first to $M^{th}$ memory devices 610-1, 610-2, . . . , and 610-M may be realized to have a chip shape. In such a case, the first to $M^{th}$ memory devices 610-1, 610-2, . . . , and 610-M having a chip shape may be vertically stacked on a package substrate to constitute one memory package. In the present embodiment, the memory controller 620 may perform a control operation for the first to $M^{th}$ memory devices 610-1, 610-2, . . . , and 610-M. In the present embodiment, the memory controller 620 may directly communicate with the first memory device 610-1 (hereinafter, also referred to as a representative memory device) among the first to $M^{th}$ memory devices 610-1, 610-2, . . . , and 610-M and does not directly communicate with the remaining memory devices 610-2, . . . , and 610-M (hereinafter, also referred to as subsidiary memory devices). That is, one of the subsidiary memory devices 610-2, . . . , and 610-M may communicate with the memory controller 620 through the representative memory device 610-1 or through the representative memory device 610-1 and at least one of the subsidiary memory devices 610-2, . . . , and 610-M. For example, a first subsidiary memory device corresponding to the second memory device 610-2 may communicate with the memory controller 620 through the representative memory device 610-1, and the last subsidiary memory device corresponding to the $M^{th}$ memory device 610-M may communicate with the memory controller 620 through the remaining subsidiary memory devices 610-2, . . . , and 610-(M−1) and the representative memory device 610-1.

The memory controller 620 may control a read operation and a write operation for each of the memory devices 610-1, 610-2, . . . , and 610-M constituting the memory medium 610. Moreover, the memory controller 620 may perform a training operation for each of the memory devices 610-1, 610-2, . . . , and 610-M constituting the memory medium 610 when a booting operation is performed or specific instructions (e.g., external training instructions) are inputted. The training operation for each of the memory devices 610-1, 610-2, . . . , and 610-M constituting the memory medium 610 may improve the reliability of data transmission or signal transmission between the memory controller 620 and each of the memory devices 610-1, 610-2, . . . , and 610-M constituting the memory medium 610. The memory controller 620 may transmit a clock signal to the representative memory device 610-1 of the memory medium 610. During the training operation for the memory medium 610, the clock signal transmitted from the memory controller 620 to the representative memory device 610-1 may be a delayed clock signal CK_D whose phase is delayed by a certain time through the training operation. During the read operation and the write operation for the memory medium 610, the clock signal transmitted from the memory controller 620 to the memory medium 610 may be a clock signal CK whose phase adjustment is completed by the training operation. The memory controller 620 may transmit a command/address signal CMD/ADDR synchronized with the clock signal CK to the representative memory device 610-1. Each of the memory devices 610-1, 610-2, . . . , and 610-M constituting the memory medium 610 may perform the read operation and the write operation of data DATA in synchronization with a data strobe signal DQS, based on the command/address signal CMD/ADDR.

The memory controller 120 may include a training core 621, a training block 622, and a bus 623. The training core 621 may generate and output a training command T_CMD instructing execution of the training operation for each of the memory devices 610-1, 610-2, . . . , and 610-M constituting the memory medium 610. The training core 621 may receive the data strobe signal DQS from the representative memory device 610-1 during the training operation for each of the memory devices 610-1, 610-2, . . . , and 610-M constituting the memory medium 610. The training core 621 may detect a timing skew between the data strobe signal DQS and the clock signal CK. In order to detect the timing skew between the data strobe signal DQS and the clock signal CK, the training core 621 may include a sampling circuit. The training core 621 may output a delay selection signal DELAY_SEL for removing the timing skew. The training command T_CMD and the delay selection signal DELAY_SEL outputted from the training core 621 may be transmitted to the training block 622 through the bus 623.

If the training command T_CMD is transmitted from the training core 621 to the training block 622, then the memory controller 620 may request the data strobe signal DQS from each of the memory devices 610-1, 610-2, . . . , and 610-M constituting the memory medium 610. In order to request and obtain the data strobe signal DQS, the memory controller 620 may perform the write operation and the read operation for each of the memory devices 610-1, 610-2, . . . , and 610-M constituting the memory medium 610. In the case that only the data stored in each of the memory devices 610-1, 610-2, . . . , and 610-M constituting the memory medium 610 are used to obtain the data strobe signal DQS, only the read operation for each of the memory devices 610-1, 610-2, . . . , and 610-M might be performed. The data strobe signal DQS outputted from the representative memory device 610-1 may be transmitted to the training block 622. The training block 622 may transmit the data strobe signal DQS to the training core 621 through the bus 623. The training block 622 may transmit the delayed clock signal CK_D, which is selected by the delay selection signal DELAY_SEL outputted from the training core 621, to the memory medium 610. The memory medium 610 may adjust a phase of the data strobe signal DQS generated by the memory medium 610 in response to the delayed clock signal CK_D. In the memory system 600 according to the present embodiment, a configuration and operations of the memory controller 620 may be substantially the same as those of the memory controller 120 described with reference to FIGS. 1 to 5.

Figure 7:
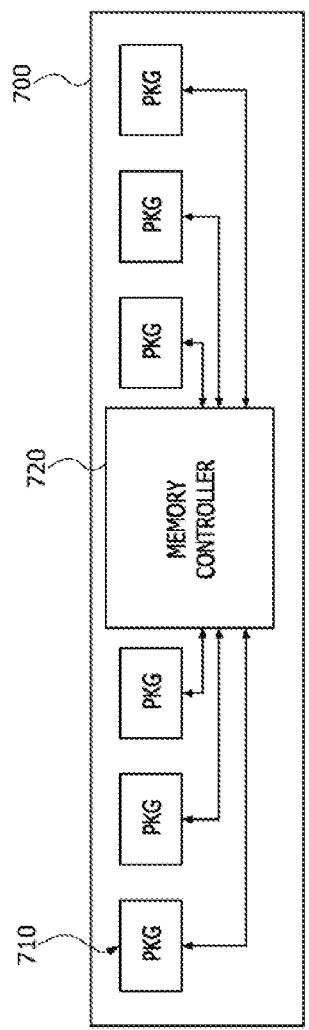
FIG. 7 illustrates a memory module employing the memory system illustrated in FIG. 6.

FIG. 7 illustrates a memory module 700 employing the memory system 600 illustrated in FIG. 6. Referring to FIGS. 6 and 7, the memory module 700 may include a plurality of memory packages 710 and a memory controller 720. Each of the memory packages 710 may correspond to the memory medium 610 including the plurality of memory devices 610-1, 610-2, . . . , and 610-M described with reference to FIG. 6. The memory controller 720 may perform various control operations to access to the plurality of memory devices 610-1, 610-2, . . . , and 610-M of each of the memory packages 710. The memory controller 720 may correspond to the memory controller 620 described with reference to FIG. 6. The plurality of memory devices 610-1, 610-2, . . . , and 610-M of each of the memory packages 710 may indirectly communicate with an external device or system through the memory controller 720. Although not shown in the drawing of FIG. 7, the memory module 700 may further include a plurality of data buffers for data transmission between the memory controller 720 and an external device or system. The training operation for the plurality of memory devices 610-1, 610-2, . . . , and 610-M constituting each of the memory packages 710 may be performed by the memory controller 720 in the same way as described with reference to FIGS. 1 to 5.

According to the above embodiments, a training core may generate and output a delay selection signal for minimizing a timing skew of a data strobe signal outputted from a memory medium and a training block may transmit a delayed clock signal generated according to the delay selection signal to the memory medium. As a result, it may be possible to reduce a logic circuit size of the training block and to reduce a training time.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:
1. A memory system comprising:
a memory medium; and
a memory controller configured to control the memory medium, wherein the memory controller includes:
a training core configured to detect a delay time of a clock signal to generate a delay selection signal during a training operation for the memory medium; and
a training block configured to generate a delayed clock signal which is delayed by a time period set according to the delay selection signal outputted from the training core, wherein the training core includes:
a training command generator to generate and output a training command instructing execution of the training operation when a booting operation is performed or external training instructions are inputted;
a sampling circuit configured to perform a sampling operation for a data strobe signal outputted from the memory medium to generate and output a timing skew information signal having information on a timing skew between the data strobe signal and a clock signal; and
a delay selection signal generator configured to generate and output a delay selection signal having delay time information for minimizing the timing skew in response to the timing skew information signal outputted from the sampling circuit, and
wherein the training block is configured to receive the training command from the training core and to receive a data strobe signal from the memory medium.

2. The memory system of claim 1, wherein the memory medium is a memory package including a representative memory device and a plurality of subsidiary memory devices which are vertically stacked on a substrate.

3. The memory system of claim 2,
wherein the representative memory device is configured to directly communicate with the memory controller; and
wherein the plurality of subsidiary memory devices are configured to communicate with the memory controller through the representative memory device.

4. The memory system of claim 2,
wherein the memory medium and the memory controller are mounted on a module substrate to constitute a memory module; and
wherein the memory medium is configured to receive data from an external device or output the data to the external device through the memory controller.

5. The memory system of claim 1, wherein the training block includes a delay circuit configured to generate the delayed clock signal having a delay time set by the delay selection signal outputted from the training core.

6. The memory system of claim 5, wherein the delay circuit includes:
a plurality of delay cells, each of which is configured to generate an output signal delayed by a time period; and
a multiplexer configured to receive the output signals of the plurality of delay cells and configured to output one of the output signals of the plurality of delay cells as the delayed clock signal based on the delay selection signal.

7. The memory system of claim 1, wherein the training block includes a write data buffer to store data to be written into the memory medium during the training operation.

8. The memory system of claim 1, wherein the training block includes a read data buffer to store data which are read out of the memory medium during the training operation.

9. The memory system of claim 1, wherein the training block includes a mode register set (MRS) buffer to store various set values by which the training operation for the memory medium is performed, in response to a command and a control signal outputted from the training core.

* * * * *